United States Patent
Herrmann et al.

(10) Patent No.: US 9,041,020 B2
(45) Date of Patent: May 26, 2015

(54) ELECTROLYTICALLY COATED OPTOELECTRONIC SEMICONDUCTOR COMPONENT AND METHOD FOR PRODUCING AN OPTOELECTRONIC SEMICONDUCTOR COMPONENT

(75) Inventors: Siegfried Herrmann, Neukirchen (DE); Helmut Fischer, Lappersdorf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 36 days.

(21) Appl. No.: 13/823,726

(22) PCT Filed: Jul. 27, 2011

(86) PCT No.: PCT/EP2011/062916
§ 371 (c)(1),
(2), (4) Date: May 31, 2013

(87) PCT Pub. No.: WO2012/034764
PCT Pub. Date: Mar. 22, 2012

(65) Prior Publication Data
US 2013/0240918 A1    Sep. 19, 2013

(30) Foreign Application Priority Data
Sep. 15, 2010   (DE) .......................... 10 2010 045 390

(51) Int. Cl.
*H01L 33/62* (2010.01)
*H01L 21/00* (2006.01)
(Continued)

(52) U.S. Cl.
CPC ............ *H01L 33/62* (2013.01); *H01L 33/0079* (2013.01); *H01L 33/38* (2013.01); *H01L 33/486* (2013.01); *H01L 33/647* (2013.01); *H01L 2224/48091* (2013.01); *H01L 2933/0016* (2013.01); *H01S 5/0217* (2013.01); *H01S 5/02256* (2013.01); *H01L 2924/01068* (2013.01);
(Continued)

(58) Field of Classification Search
CPC ............. H01L 33/0079; H01L 33/647; H01L 31/02002; H01L 31/0203; H01L 33/48; H01L 33/486; H01L 33/62; H01L 33/385
USPC ......... 257/88, 99, E33.057, E33.062; 438/26, 438/28
See application file for complete search history.

(56) References Cited

U.S. PATENT DOCUMENTS 7,195,944 B2 *  3/2007  Tran et al. ........................ 438/46
7,759,670 B2 *  7/2010  Liu et al. ......................... 257/13
(Continued)

FOREIGN PATENT DOCUMENTS

CN            1945866 A      4/2007
CN          101675539 A      3/2010
(Continued)

*Primary Examiner* — Minh-Loan Tran
(74) *Attorney, Agent, or Firm* — McDermott Will & Emery LLP

(57) ABSTRACT

The invention relates to an optoelectronic semiconductor component, comprising a substrate-free optoelectronic semiconductor chip (1), which has a first main surface (1a) on an upper face and a second main surface (1b) on a lower face, and a metal carrier (2), which is arranged on the lower face of the optoelectronic semiconductor chip (1), wherein the metal carrier (2) protrudes over the optoelectronic semiconductor chip (1) in at least one lateral direction (1) and the metal carrier (2) is deposited on the second main surface (1b) of the optoelectronic semiconductor chip (1) using a galvanic or electroless plating method.

15 Claims, 5 Drawing Sheets

Figure 1A:
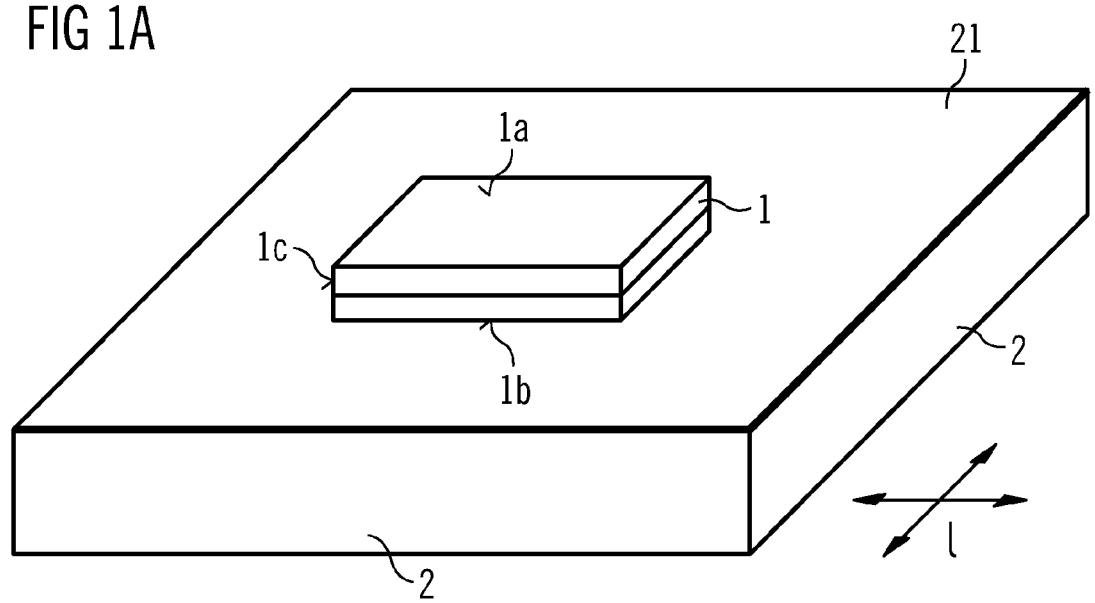

(51) Int. Cl.
*H01L 33/00* (2010.01)
*H01L 33/64* (2010.01)
*H01S 5/02* (2006.01)
*H01S 5/022* (2006.01)
*H01L 33/38* (2010.01)
*H01L 33/48* (2010.01)

(52) U.S. Cl.
CPC ....... *H01L 33/48* (2013.01); *H01L 2224/48247* (2013.01)

(56) References Cited

U.S. PATENT DOCUMENTS

2007/0077673 A1  4/2007  Hwang et al.
2008/0113462 A1  5/2008  Kim et al.

FOREIGN PATENT DOCUMENTS

| | | |
|---|---|---|
| CN | 101711432 A | 5/2010 |
| DE | 10355600 A1 | 6/2005 |
| DE | 102005053274 A1 | 4/2007 |
| DE | 102007022947 A1 | 10/2008 |
| DE | 102007029370 A1 | 11/2008 |
| DE | 102007035896 A1 | 2/2009 |
| DE | 102007046743 A1 | 4/2009 |
| DE | 102008035900 A1 | 11/2009 |
| DE | 102008035254 A1 | 2/2010 |
| EP | 1653523 A2 | 5/2006 |
| JP | 2004047704 A | 2/2004 |
| KR | 102008004364 | 5/2008 |
| KR | 102010001640 | 2/2010 |
| WO | 2006032252 A1 | 3/2006 |
| WO | WO-2008154573 A1 | 12/2008 |
| WO | 2009079978 A1 | 7/2009 |

\* cited by examiner

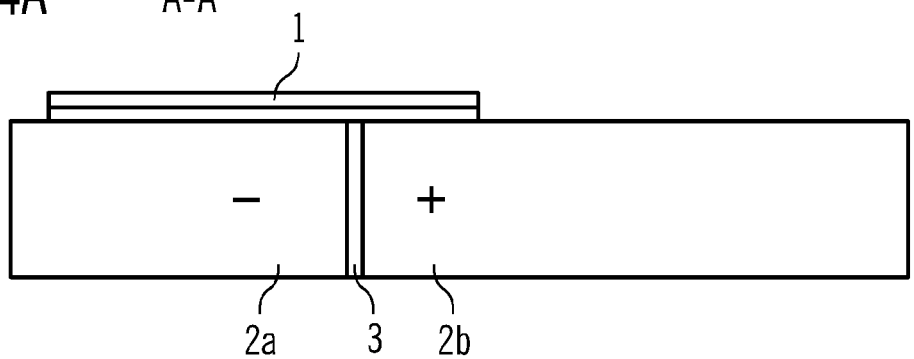
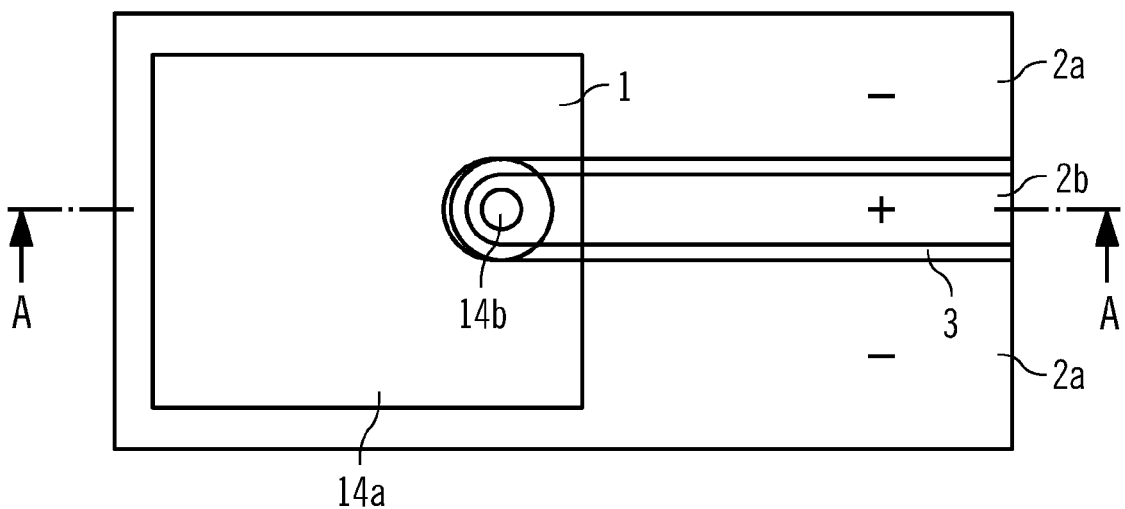

ELECTROLYTICALLY COATED OPTOELECTRONIC SEMICONDUCTOR COMPONENT AND METHOD FOR PRODUCING AN OPTOELECTRONIC SEMICONDUCTOR COMPONENT

This patent application claims the priority of German patent application DE 10 2010 045 390.0, the disclosure content of which is hereby incorporated by reference.

An optoelectronic semiconductor component is specified. Furthermore, a method for producing an optoelectronic semiconductor component is specified.

The documents DE 102005053274, WO 2006/032252 and WO 2009/079978 describe optoelectronic semiconductor components.

One object to be achieved is to specify an optoelectronic semiconductor component which has improved thermal properties.

In accordance with at least one embodiment of the optoelectronic semiconductor component, the optoelectronic semiconductor component comprises at least one substrateless optoelectronic semiconductor chip. The optoelectronic semiconductor chip can be a radiation-emitting semiconductor chip, in particular a luminescence diode. The optoelectronic semiconductor chip is then formed by a laser diode or by a light-emitting diode. Preferably, the optoelectronic semiconductor chip is designed for generating electromagnetic radiation in the wavelength range between UV radiation and infrared radiation, in particular visible light. Furthermore, it is possible for the optoelectronic semiconductor chip to be a radiation-detecting semiconductor chip, that is to say for example a photodiode.

In the present case, the optoelectronic semiconductor chip is embodied in a substrateless fashion. That is to say that a growth substrate onto which the semiconductor layers of the optoelectronic semiconductor chip are grown epitaxially is removed from the epitaxially grown layers. The optoelectronic semiconductor chip therefore consists of its epitaxially grown semiconductor layers and, if appropriate, of metallizations applied to an outer surface of the semiconductor body formed by the epitaxially grown semiconductor layers. In this case, the substrateless optoelectronic semiconductor chip is distinguished, inter alia, by its small thickness. Preferably, the substrateless optoelectronic semiconductor chip has a thickness of less than 10 μm, preferably less than 7 μm, for example approximately 6 μm.

The substrateless optoelectronic semiconductor chip has a first main face at its top side and a second main face at its underside. The two main faces can be connected to one another by at least one side face. By way of example, electromagnetic radiation generated during operation emerges from the substrateless optoelectronic semiconductor chip for the most part through the first main face. The second main face can then serve as a mounting face, by which the optoelectronic semiconductor chip is mounted on a carrier. In this case, it is possible for the connection locations for making the electrical contact with the optoelectronic semiconductor chip to be arranged at the second main face. The optoelectronic semiconductor chip can be surface-mountable in this case.

In accordance with at least one embodiment of the optoelectronic semiconductor component, the optoelectronic semiconductor component comprises a metallic carrier which is arranged at the underside of the optoelectronic semiconductor chip. The metallic carrier is formed with a material having metallic properties. By way of example, the metallic carrier consists of a metal or a metal alloy. The metallic carrier is arranged at the underside of the optoelectronic semiconductor chip and is preferably mechanically fixed there to the optoelectronic semiconductor chip.

In accordance with at least one embodiment of the optoelectronic semiconductor component, the metallic carrier is deposited electrolytically or in an electroless fashion at the second main face of the optoelectronic semiconductor chip. That is to say that the metallic carrier is produced by electrolytic or electroless deposition. Production by electrolytic or electroless deposition is a substantive feature which, on the finished optoelectronic semiconductor component, is clearly distinguishable from other production methods. In particular, on account of the absence of a connecting means such as, for instance, a solder metallization between metallic carrier and optoelectronic semiconductor chip, it can be clearly demonstrated that the metallic carrier has been deposited at the second main face of the optoelectronic semiconductor chip rather than being fixed to the optoelectronic semiconductor chip for instance in some other way.

In accordance with at least one embodiment of the optoelectronic semiconductor component, the metallic carrier projects beyond the optoelectronic semiconductor chip in at least one lateral direction. In this case, the lateral directions are, for example, those directions which run parallel to the second main face of the optoelectronic semiconductor chip. Therefore, in the present case, the metallic carrier does not terminate flush with the optoelectronic semiconductor chip in a lateral direction, but rather projects beyond said chip at at least one side face. Preferably, the metallic carrier completely projects beyond the optoelectronic semiconductor chip. That is to say that the metallic carrier then projects beyond the optoelectronic semiconductor chip in all lateral directions, that is to say at all side faces of the optoelectronic semiconductor chip. Overall, the metallic carrier thereby has a larger basic area than the optoelectronic semiconductor chip.

In accordance with at least one embodiment of the optoelectronic semiconductor component, the semiconductor component comprises a substrateless optoelectronic semiconductor chip having a first main face at a top side and a second main face at an underside. Furthermore, the optoelectronic semiconductor component comprises a metallic carrier, which is arranged at the underside of the optoelectronic semiconductor chip, wherein the metallic carrier projects beyond the optoelectronic semiconductor chip in at least one lateral direction, and the metallic carrier is deposited electrolytically or in an electroless fashion at the second main face of the optoelectronic semiconductor chip.

In the case of metallic carriers deposited electrolytically or in an electroless fashion, the deposition of the metallic carriers onto the optoelectronic semiconductor chips has hitherto taken place in the wafer assemblage for reasons of efficiency. Owing to this, the carrier terminates flush with the optoelectronic semiconductor chip in a lateral direction. The optoelectronic semiconductor component described in the present case allows this geometry dependence between optoelectronic semiconductor chip and metallic carrier to be broken up. The metallic carrier can have different geometrical dimensions and forms than the optoelectronic semiconductor chip. This allows a scaleable metallic carrier distinguished, for example, by an improved thermal coupling during the use of the optoelectronic semiconductor component. In other words, the metallic carrier on which the optoelectronic semiconductor chip is situated can be designed in a geometrically variable manner. The metallic carrier, that is to say the base of the optoelectronic semiconductor chip, can be expanded in a lateral direction. By way of example, an improved thermal coupling of the optoelectronic semiconductor component can be achieved as a result.

Furthermore, a method for producing an optoelectronic semiconductor component is specified. In accordance with at least one embodiment of the method, firstly a multiplicity of optoelectronic semiconductor chips is provided, wherein each of the optoelectronic semiconductor chips has a first main face at a top side and a second main face at an underside. The optoelectronic semiconductor chips involve substrateless optoelectronic semiconductor chips. That is to say that the growth substrate of the optoelectronic semiconductor chips is removed before the providing process and, as early as before the process of providing the multiplicity of substrateless optoelectronic semiconductor chips, for example a semiconductor wafer is singulated into the multiplicity of substrateless optoelectronic semiconductor chips.

In accordance with at least one embodiment of the method, a next method step involves arranging and mechanically fixing the multiplicity of optoelectronic semiconductor chips on an intermediate carrier. For this purpose, the intermediate carrier can consist for example of a ceramic material or glass. The fixing can be effected by means of a releasable adhesive-bonding connection, for example. The optoelectronic semiconductor chips can be arranged on the intermediate carrier at arbitrary distances with respect to one another. Preferably, the optoelectronic semiconductor chips are arranged in a manner spaced apart from one another, such that a respective interspace is formed between two mutually directly adjacent optoelectronic semiconductor chips. Later, in the finished optoelectronic semiconductor component, the size of said interspace determines the lateral extent of the carrier and thus how far the carrier projects beyond the optoelectronic semiconductor chip in a lateral direction. In the case of optoelectronic semiconductor chips which are subjected to particularly high thermal loading, for example, the interspace can be chosen to be particularly large, thus resulting in a metallic carrier that projects beyond the optoelectronic semiconductor chip particularly far in a lateral direction.

In accordance with at least one embodiment of the method, a next method step involves filling the interspaces with an electrically insulating layer. In this case, the filling takes place for example in such a way that the electrically insulating layer terminates flush with that side of the optoelectronic semiconductor chips which faces away from the intermediate carrier, that is to say the second main face of the optoelectronic semiconductor chip at its underside. The electrically insulating layer can be formed for example with a silicone, an epoxy resin or a combination of these materials. Furthermore, it is possible for the electrically insulating layer to contain PCB or a spin-on glass or to consist of one of these materials.

In accordance with at least one embodiment of the method, a next method step involves applying a seed layer to that side of the optoelectronic semiconductor chips and of the electrically insulating layer which faces away from the intermediate carrier. The seed layer is formed with a metallic material, for example, and can be applied by vapor deposition or sputtering. The seed layer forms an intimate connection with the optoelectronic semiconductor chips and the electrically insulating layer. A metallic carrier is subsequently deposited onto the seed layer electrolytically or in an electroless fashion.

In accordance with at least one embodiment of the method for producing an optoelectronic semiconductor component, the method comprises the following steps:

providing a multiplicity of optoelectronic semiconductor chips, wherein each of the optoelectronic semiconductor chips has a first main face at a top side and a second main face at an underside, arranging and fixing the multiplicity of optoelectronic semiconductor chips on an intermediate carrier, wherein the optoelectronic semiconductor chips are arranged in a manner spaced apart from one another, such that a respective interspace is formed between two mutually directly adjacent optoelectronic semiconductor chips, filling the interspaces with an electrically insulating layer, applying a seed layer to that side of the optoelectronic semiconductor chips and of the electrically insulating layer which faces away from the intermediate carrier, and depositing a metallic carrier onto the seed layer electrolytically or in an electroless fashion.

An optoelectronic semiconductor component described here can preferably be produced by means of the method described here. That is to say that all features disclosed for the method are also disclosed for the optoelectronic semiconductor component, and vice versa. The following embodiments relate both to the optoelectronic semiconductor component and to the method described here.

In accordance with at least one embodiment, the metallic carrier projects beyond the optoelectronic semiconductor chip in at least one lateral direction by at least 100 μm, preferably by at least 250 μm. In this case, it is possible for the metallic carrier to project beyond the optoelectronic semiconductor chip in all lateral directions by at least 100 μm, preferably by at least 250 μm.

In accordance with at least one embodiment, the metallic carrier projects beyond the optoelectronic semiconductor chip in at least one lateral direction by at least 10%, preferably by at least 25%, of the maximum edge length of the optoelectronic semiconductor chip. In this case, the maximum edge length of the optoelectronic semiconductor chip is the length of the longer of the two edges in the case of a rectangular optoelectronic semiconductor chip. In the case of a round optoelectronic semiconductor chip, the maximum edge length is the diameter of the optoelectronic semiconductor chip.

In accordance with at least one embodiment, a seed layer is arranged between the metallic carrier and the second main face of the optoelectronic semiconductor chip, said seed layer at least in places being in direct contact with the metallic carrier and the second main face of the optoelectronic semiconductor chip. In this case, the seed layer can consist of the same material as or of a different material than the metallic carrier. By way of example, the seed layer is applied by means of sputtering or vapor deposition. The seed layer imparts a mechanically fixed connection between optoelectronic semiconductor chip and metallic carrier, which can be released only by destroying the optoelectronic semiconductor component.

In accordance with at least one embodiment of the optoelectronic semiconductor component, the seed layer is designed to reflect electromagnetic radiation that is to be emitted or detected by the optoelectronic semiconductor chip. Preferably, the seed layer for this purpose then has a reflectivity of at least 50%, for example of at least 75%, for said electromagnetic radiation. The seed layer can contain silver, for example.

In accordance with at least one embodiment, the metallic carrier is electrically conductive and forms at least one electrical connection location of the optoelectronic semiconductor component. That is to say that the metallic carrier is electrically conductively connected to at least one contact location of the optoelectronic semiconductor chip, for example that side of the metallic carrier which faces away from the optoelectronic semiconductor chip then forms at least one electrical connection location of the optoelectronic semiconductor component via which contact can be made with the latter. In this embodiment, the seed layer is also embodied in an electrically conductive fashion, such that an electric current impressed via the metallic carrier passes through the seed layer into the optoelectronic semiconductor chip.

In accordance with at least one embodiment, the metallic carrier comprises partial regions electrically insulated from one other, wherein each of the partial regions forms an electrical connection location of the optoelectronic semiconductor component, and the electrical connection locations are of opposite polarity. That is to say that the metallic carrier is divided into at least two partial regions that form connection locations for making n- and p-side contact with the optoelectronic semiconductor chip.

In this way, it is possible for the optoelectronic semiconductor component to be surface-mountable, wherein the connection locations are formed at that side of the metallic carrier which faces away from the optoelectronic semiconductor chip.

In accordance with at least one embodiment, the metallic carrier contains or consists of one of the following materials: nickel, copper, gold, palladium. In this case, it is possible for the metallic carrier to have regions, for example layers, of other materials. Thus, the metallic carrier can have, from its side facing the optoelectronic semiconductor chip to its side facing away from the optoelectronic semiconductor chip, the following layer construction, for example: a layer composed of nickel, a layer composed of palladium, a layer composed of gold.

In accordance with at least one embodiment, the optoelectronic semiconductor component comprises a multiplicity of substrateless optoelectronic semiconductor chips, wherein the metallic carrier completely projects beyond all the optoelectronic semiconductor chips in a lateral direction. The optoelectronic semiconductor chips can then in particular also be optoelectronic semiconductor chips which emit light of different colors. By way of example, the optoelectronic semiconductor component then comprises at least one red light, one green light and one blue light emitting optoelectronic semiconductor chip. The optoelectronic semiconductor chips of the optoelectronic semiconductor component can be electrically isolated from one another, such that they are operable independently of one another.

In accordance with at least one embodiment, the optoelectronic semiconductor component comprises exactly one single substrateless optoelectronic semiconductor chip.

In accordance with at least one embodiment, the optoelectronic semiconductor component comprises an electrically insulating layer, which covers the metallic carrier at its outer surface facing the optoelectronic semiconductor chip and outer surface free of the optoelectronic semiconductor chip, wherein the electrically insulating layer covers a side face of the optoelectronic semiconductor chip at least in places. In other words, the top side of the metallic carrier facing the optoelectronic semiconductor chip is covered with the optoelectronic semiconductor chip and the electrically insulating layer. In this case the electrically insulating layer can terminate for example flush with the first main face of the optoelectronic semiconductor chip facing away from the carrier. The optoelectronic semiconductor chip can be covered by the electrically insulating layer completely at its side faces. The main face of the carrier facing the optoelectronic semiconductor chip at the top side of the carrier is therefore covered completely by the electrically insulating layer and the optoelectronic semiconductor chip.

In accordance with at least one embodiment, the electrically insulating layer is designed to reflect electromagnetic radiation that is to be emitted or detected by the optoelectronic semiconductor chip during operation. For this purpose, the electrically insulating layer can comprise, for example, particles of a filler. Reflective means that the electrically insulating layer has a reflectivity of in particular more than 80% or of more than 90%, preferably of more than 94%, for radiation in the visible spectral range. The electrically insulating layer preferably reflects diffusely. For an observer, the electrically insulating layer preferably appears white. The reflective particles are produced for example from a metal oxide such as aluminum oxide or titanium oxide, from a metal fluoride such as calcium fluoride or from a silicon oxide or consist thereof. An average diameter of the particles, for example a median diameter $d_{50}$ in $Q_0$, is preferably between 0.3 μm and 5 μm inclusive. A proportion by weight of the particles in the entire reflective layer is preferably between 5% and 50% inclusive, in particular between 10% and 30% inclusive. The particles have a reflective effect on account of their preferably white color and/or on account of their difference in refractive index with respect to the matrix material.

In accordance with at least one embodiment, only the first main face of the optoelectronic semiconductor chip is freely accessible. That is to say that, apart from the first main face, the optoelectronic semiconductor chip is completely covered. In this case, the optoelectronic semiconductor chip can be covered for example by the seed layer, the metallic carrier and/or the electrically insulating layer. In this way it can be ensured, for example, that the optoelectronic semiconductor chip, if it is a radiation-emitting semiconductor chip, emits the electromagnetic radiation generated during operation exclusively through the first main face.

In accordance with at least one embodiment, prior to the electrolytic or electroless deposition, electrically insulating separating structures are produced on the seed layer and cover the seed layer in places. These separating structures serve for forming partial regions of the metallic carrier which are electrically insulated from one another and which form, in the completed optoelectronic semiconductor component, connection locations of the optoelectronic semiconductor component, which can be of opposite polarities.

The optoelectronic semiconductor component described here and the method described here for producing an optoelectronic semiconductor component are explained in greater detail below on the basis of exemplary embodiments and the associated figures.

Figure 1B:
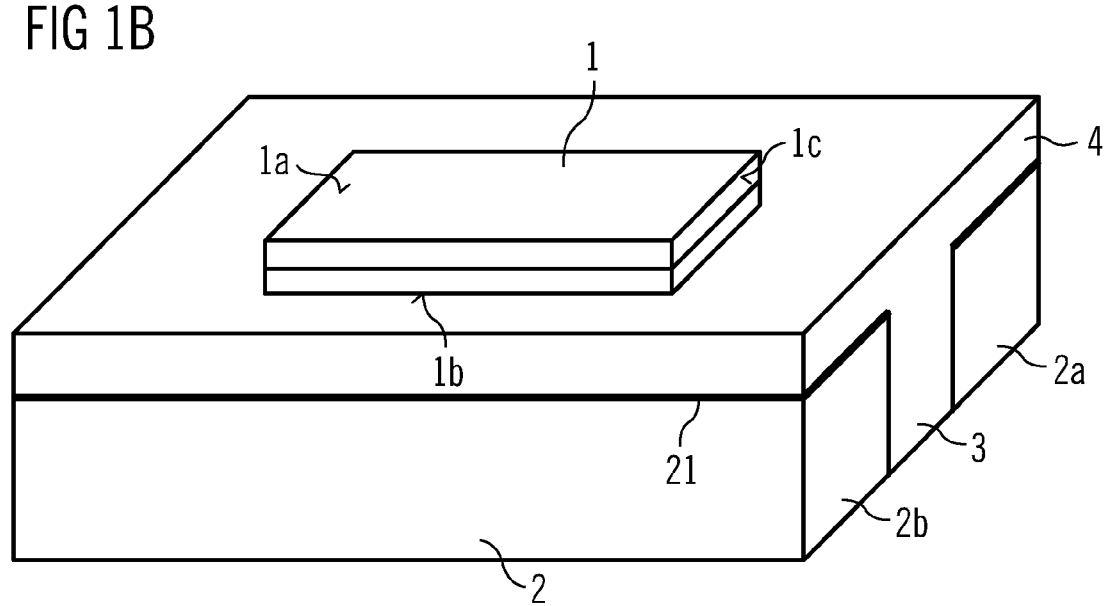

FIGS. 1A and 1B show, on the basis of schematic perspective illustrations, two exemplary embodiments of optoelectronic semiconductor components described here.

With reference to FIGS. 2A, 2B, 2C, 2D, 2E, 3A, 3B, 3C, 3D, 3E, 3F, 3G, exemplary embodiments of methods described here are explained in greater detail.

With reference to the schematic illustrations in FIGS. 4A and 4B, a further exemplary embodiment of an optoelectronic semiconductor component described here is explained in greater detail.

Elements which are identical, of identical type of act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

In conjunction with the perspective schematic illustration in FIG. 1A, a first exemplary embodiment of an optoelectronic semiconductor component described here is explained in greater detail. The optoelectronic semiconductor component comprises a substrateless optoelectronic semiconductor chip 1. The substrateless optoelectronic semiconductor chip 1 is free of a growth substrate. The optoelectronic semiconductor chip is for example a luminescence diode chip, for example a light-emitting diode, or a radiation-detecting chip such as photodiode, for instance.

The optoelectronic semiconductor chip has a first main face 1*a* at its top side. The optoelectronic semiconductor chip 1 has a second main face 1*b* at its underside. By way of example, the optoelectronic semiconductor chip is embodied in a parallelepipedal fashion, such that the first main face 1*a* and the second main face 1*b* have the same form and size.

The optoelectronic semiconductor component furthermore comprises a metallic carrier 2. The metallic carrier is produced by electrolytic or electroless deposition. A seed layer 21 is arranged between the metallic carrier 2 and the second main face 1*b* of the optoelectronic semiconductor chip 1, said seed layer imparting a mechanically fixed connection between the metallic carrier 2 and the optoelectronic semiconductor chip 1. The carrier 2 projects beyond the optoelectronic semiconductor chip 1 completely at the side faces 1*c* thereof in all lateral directions 1. By way of example, the basic area of the carrier 2 is at least double the magnitude of the area content of the second main face 1*b* and/or of the first main face 1*a* of the optoelectronic semiconductor chip.

In the present case, the carrier 2 is embodied in an electrically conductive fashion. The seed layer 21 is also embodied in an electrically conductive fashion. The carrier 2 therefore forms an electrical connection location of the optoelectronic semiconductor component and for this purpose is electrically conductively connected to the optoelectronic semiconductor chip 1 at the underside 1*b*.

In conjunction with the schematic perspective illustration in FIG. 1B, a further exemplary embodiment of an optoelectronic semiconductor component described here is explained in greater detail. In this exemplary embodiment, the carrier 2 has two partial regions 2*a*, 2*b*, which are electrically insulated from one another by an electrically insulating material 3. The electrically insulating material can be formed for example with silicone, epoxy resin, a ceramic material or a vitreous material. The partial regions 2*a*, 2*b* form connection locations of opposite polarities of the optoelectronic semiconductor chip 1. By way of example, for this purpose they are electrically conductively connected to different regions of the optoelectronic semiconductor chip 1 at the underside 1*b* of the optoelectronic semiconductor chip 1.

In the present case, the optoelectronic semiconductor component is therefore surface-mountable, that is to say that it can be mechanically fixed and electrically contact-connected by an adhesive-bonding or soldering connection at the underside of the carrier 2 facing away from the semiconductor chip 1.

As a further difference with respect to the optoelectronic semiconductor component in accordance with FIG. 1A, the optoelectronic semiconductor component in the exemplary embodiment in FIG. 1B comprises an electrically insulating layer 4, which covers the optoelectronic semiconductor chip 1 at the side faces 1*c* thereof and can terminate flush with the first main face 1*a*, such that the optoelectronic semiconductor chip 1 and the electrically insulating layer 4 do not mutually project beyond one another. By way of example, it is possible for the electrically insulating layer 4 to be embodied in a radiation-reflecting fashion and for this purpose to be provided with particles of a filler.

Furthermore, it is possible for the electrically insulating layer 4 and the electrically insulating material 3 to be formed with the same material. In this case, the electrically insulating layer 4 can cover the seed layer 21, for example. In the region of the electrically insulating material 3, however, the seed layer 21 is removed, such that the electrically insulating layer 4 and the electrically insulating material 3 are in direct contact with one another.

In conjunction with FIGS. 2A to 2E, a first exemplary embodiment of a method described here for producing an optoelectronic semiconductor component is explained in greater detail. In a first method step, substrateless optoelectronic semiconductor chips 1 are applied by their first main faces 1*a* to an intermediate carrier 5, which can be formed with glass, for example. The mechanical adhesion between intermediate carrier 5 and optoelectronic semiconductor chips 1 is imparted by a connection means layer 6, which is an adhesive-bonding connection, for example. Interspaces 7 are formed between the optoelectronic semiconductor chips 1.

The interspaces 7 are subsequently provided with the electrically insulating layer 4, which can be formed for example with PCB or spin-on glass.

In a next method step, the seed layer 21 is applied to the top side of the assemblage facing away from the intermediate carrier 5. The seed layer 21 is followed by the metallic carrier assemblage 20, which is deposited onto the seed layer 21 for example electrolytically or in an electroless fashion (cf. FIG. 2B).

In a further method step (FIG. 2C), the intermediate carrier 5 is removed again. At the side facing away from the carrier assemblage 20, the first main faces 1*a* of the optoelectronic semiconductor chips 1 are exposed.

Figure 2A:
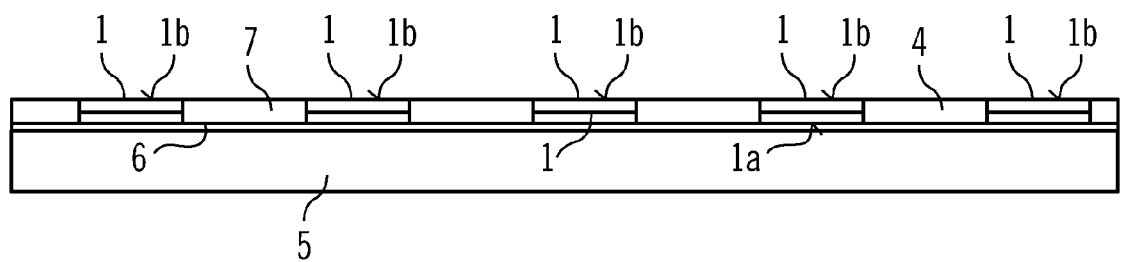
Figure 2B:
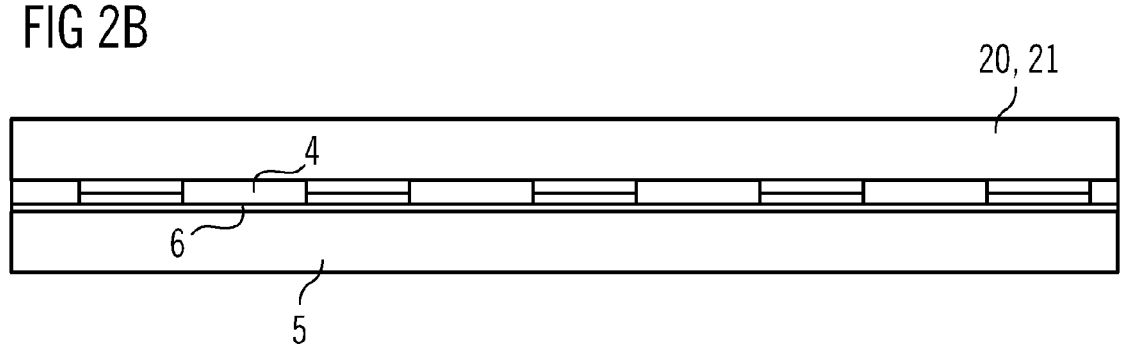
Figure 2C:
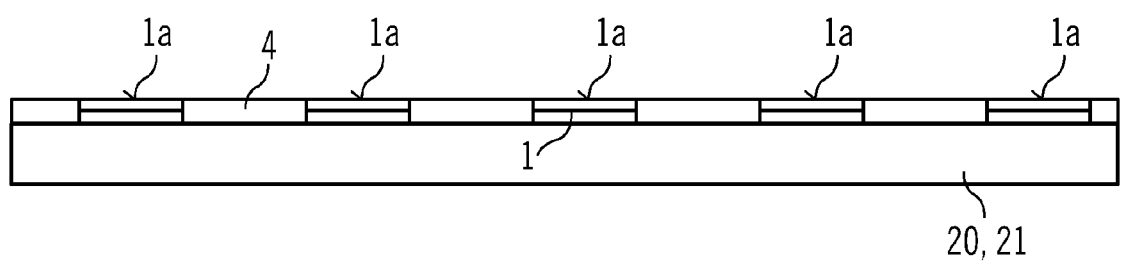
Figure 2D:
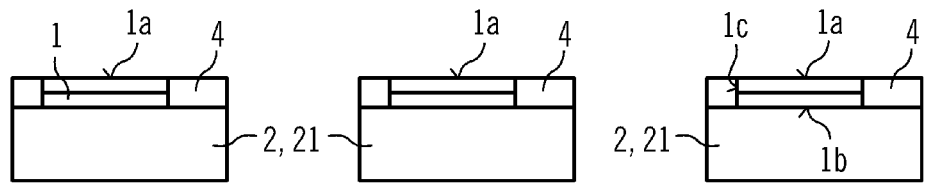

A further method step 2*d* involves carrying out singulation to form individual optoelectronic semiconductor components each comprising a metallic carrier 2 and at least one optoelectronic semiconductor chip 1, cf. FIG. 2D.

As illustrated in conjunction with FIG. 2E, the optoelectronic semiconductor component can subsequently be fixed to a connection carrier, for example a lead frame 11 by the underside of the metallic carrier 2 facing away from the optoelectronic semiconductor chip 1, for example by soldering. The metallic carrier 2 then forms a first electrical connection location of the optoelectronic semiconductor component. A second electrical connection location is formed by the bonding pad 10*a* at the first main face 1*a* of the optoelectronic semiconductor chip 1, said bonding pad being connected to a corresponding bonding pad 10*b* of the lead frame 11 by means of a connection wire 9.

Figure 2E:
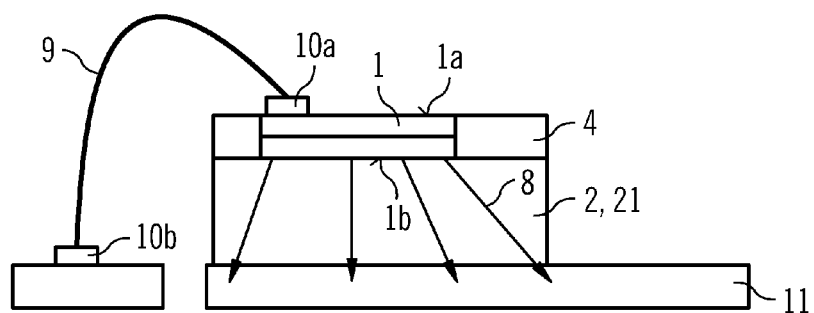

As illustrated schematically in FIG. 2E, heat 8 generated by the optoelectronic semiconductor chip 1 during operation can be dissipated through the metallic carrier 2 to the lead frame 11 over a particularly large area.

In conjunction with FIGS. 3A to 3G, a further exemplary embodiment of a method described here for producing an optoelectronic semiconductor component is explained in greater detail. A difference with respect to the method described in conjunction with FIGS. 2A to 2E arises here in the method step illustrated schematically in FIG. 3C. In this method step, electrically insulating separating structures are formed for example by exposing and developing a photoresist 12 on that side of the seed layer 21 which faces away from the intermediate carrier 5. In the next method step, FIG. 3D, the separating structures 12 form electrical isolators during the deposition of the carrier assemblage 20 electrolytically or in an electroless fashion.

Figure 3A:
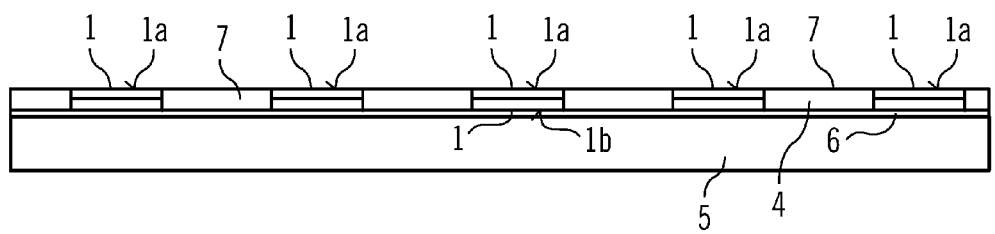
Figure 3B:
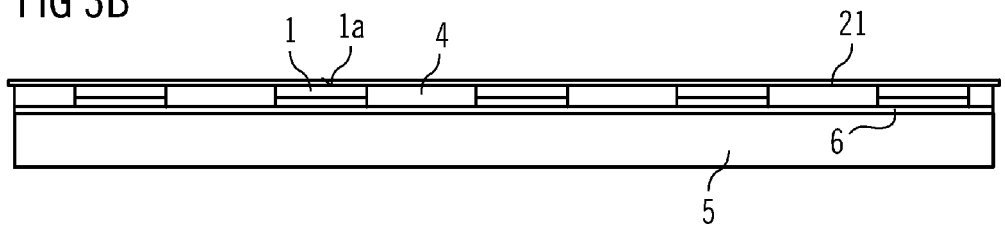
Figure 3C:
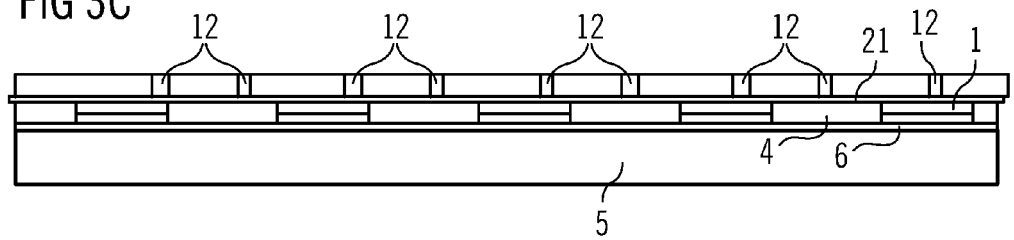
Figure 3D:
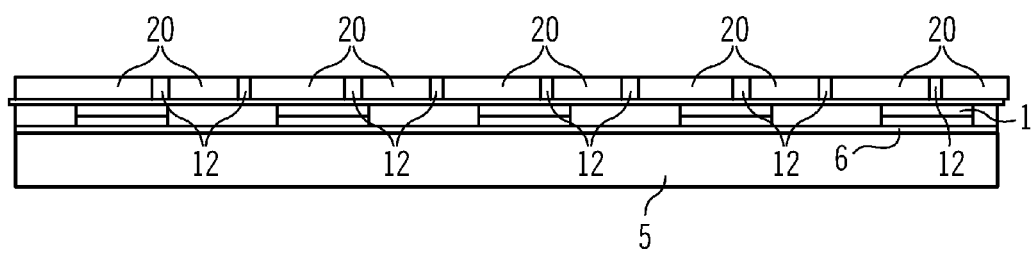
Figure 3E:
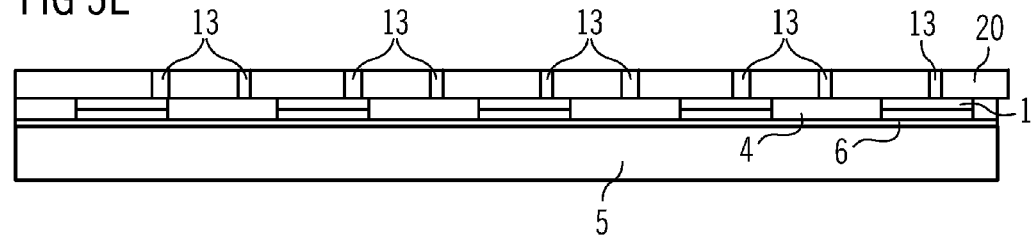

In a further method step, FIG. 3E, the electrically insulating separating structures 12 are detached, thus giving rise to perforations 13 in the carrier assemblage 20.

Figure 3F:
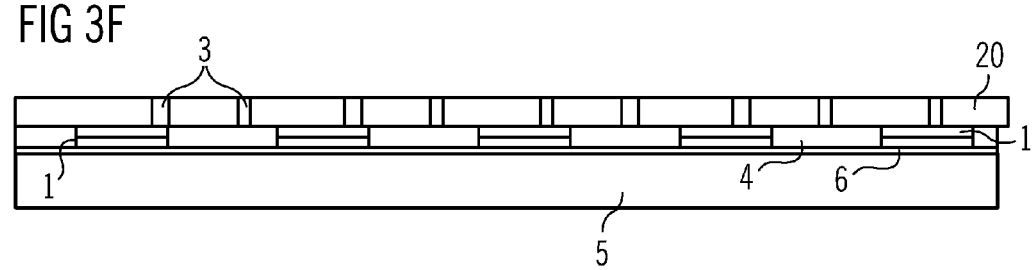

FIG. 3F illustrates that the perforations 13 are subsequently filled with the electrically insulating material 3.

Figure 3G:
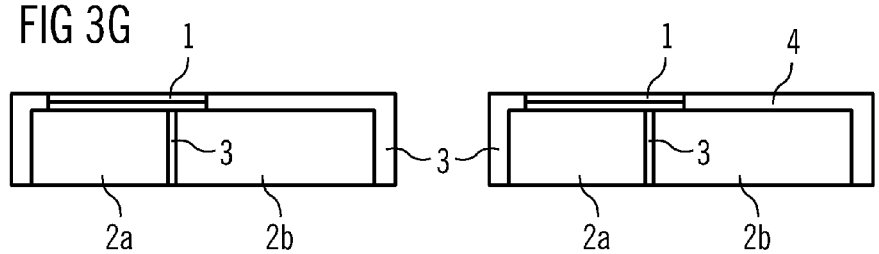

Singulation gives rise to the optoelectronic semiconductor components illustrated in FIG. 3G, which comprise a metallic carrier 2 having two partial regions 2a, 2b forming electrical connection locations of opposite polarities of the optoelectronic semiconductor component. Singulation can be effected, for example, as also in the exemplary embodiment in FIGS. 2A to 2E, by means of a phototechnology and subsequent etching, for example using FeCl3.

In conjunction with FIGS. 4A and 4B, a further exemplary embodiment of an optoelectronic semiconductor component described here is explained in greater detail, which can be produced for example by a method similar to the method described in conjunction with FIGS. 3A to 3G. In contrast to the method described in conjunction with FIGS. 3A to 3G, the electrically insulating layer 4 is dispensed with by being removed again after the conclusion of the method. Alternatively, however, the layer 4 can also remain in the optoelectronic semiconductor component.

The contact-connection of the optoelectronic semiconductor chip 1 is now illustrated in greater detail with reference to FIGS. 4A and 4B. The optoelectronic semiconductor chip 1 has at its underside, that is to say at the second main face 1b, a contact location 14a and a contact location 14b insulated therefrom. The electrically insulated contact location 14b serves, for example, for the p-side connection of the optoelectronic semiconductor chip 1, while the contact location 14a serves for the n-side connection.

By way of example, proceeding from the p-side contact location 14b, a perforation can be formed through the n-conducting semiconductor material and an active region of the optoelectronic semiconductor chip 1, the perforation being coated with an electrically insulating material and filled with an electrically conductive material which produces an electrical contact with the p-side of the semiconductor chip 1. Alternatively, the perforation can also be connected to the n-conducting semiconductor material, that is to say that, in contrast to the illustration shown in FIG. 4B, n-side and p-side contacts can also be interchanged.

The electrically insulating material 3 is now arranged in a trench in such a way that a partial region 2b of the carrier 2 arises, which is electrically insulated from the partial regions 2a. In this way, two connection locations for making electrical contact with the optoelectronic semiconductor component are arranged at the underside of the carrier facing away from the semiconductor chip 1. In this case, FIG. 4B shows a sectional illustration along the interface between carrier 2 and optoelectronic semiconductor chip 1.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

We claim:

1. An optoelectronic semiconductor component comprising:
    a substrateless optoelectronic semiconductor chip having a first main face at a top side and a second main face at an underside; and
    a metallic carrier, which is arranged at the underside of the optoelectronic semiconductor chip,
    wherein the metallic carrier projects beyond the optoelectronic semiconductor chip in at least one lateral direction,
    wherein the metallic carrier is deposited electrolytically or in an electroless fashion at the second main face of the optoelectronic semiconductor chip, and
    wherein the metallic carrier comprises partial regions electrically insulated from one another, each of the partial regions forming an electrical connection location of the optoelectronic semiconductor component, the electrical connection locations being of opposite polarity.

2. The optoelectronic semiconductor component according to claim 1, wherein a seed layer is arranged between the metallic carrier and the second main face of the optoelectronic semiconductor chip, said seed layer at least in places being in direct contact with the metallic carrier and the second main face of the optoelectronic semiconductor chip.

3. The optoelectronic semiconductor component according to claim 2, wherein the seed layer is designed to reflect electromagnetic radiation that is to be emitted or detected by the optoelectronic semiconductor chip during operation.

4. The optoelectronic semiconductor component according to claim 1, wherein the optoelectronic semiconductor chip, apart from the first main face, is covered completely, in particular by the seed layer, the metallic carrier and/or an electrically insulating layer.

5. The optoelectronic semiconductor component according to claim 1, comprising an electrically insulating layer, which covers the metallic carrier at its outer surface which faces the optoelectronic semiconductor chip, the outer surface being free of the optoelectronic semiconductor chip, wherein the electrically insulating layer covers a side face of the optoelectronic semiconductor chip at least in places.

6. The optoelectronic semiconductor component according to claim 5, wherein the electrically insulating layer is designed to reflect electromagnetic radiation that is to be emitted or detected by the optoelectronic semiconductor chip during operation, wherein the electrically insulating layer appears white, in particular.

7. The optoelectronic semiconductor component according to claim 1, wherein the metallic carrier is electrically conductive and forms at least one electrical connection location of the optoelectronic semiconductor component.

8. The optoelectronic semiconductor component according to claim 1, which is surface-mountable.

9. The optoelectronic semiconductor component according to claim 1, wherein the metallic carrier completely projects beyond the optoelectronic semiconductor chip laterally.

10. The optoelectronic semiconductor component according to claim 1, comprising a multiplicity of substrateless optoelectronic semiconductor chips, wherein the metallic carrier completely projects beyond all the optoelectronic semiconductor chips in a lateral direction.

11. The optoelectronic semiconductor component according to claim 1, wherein the optoelectronic semiconductor chip is a radiation-emitting semiconductor chip which emits electromagnetic radiation during operation exclusively through the first main face.

12. A method for producing an optoelectronic semiconductor component comprising the following steps in the following order:
    a) providing a multiplicity of discrete substrateless optoelectronic semiconductor chips, wherein the substrateless optoelectronic semiconductor chips are separated from each other and each of the optoelectronic semiconductor chips has a first main face at a top side and a second main face at an underside;
    b) arranging and fixing the multiplicity of optoelectronic semiconductor chips on an intermediate carrier, wherein the optoelectronic semiconductor chips are arranged in a manner spaced apart from one another, such that a respective interspace is formed between two mutually directly adjacent optoelectronic semiconductor chips;

c) filling the interspaces with an electrically insulating layer; applying a seed layer to that side of the optoelectronic semiconductor chips and of the electrically insulating layer which faces away from the intermediate carrier; and depositing a metallic carrier onto the seed layer electrolytically or in an electroless fashion.

13. The method according to claim 12, wherein, prior to the electrolytic or electroless deposition, electrically insulating separating structures are produced on the seed layer and cover the seed layer in places.

14. An optoelectronic semiconductor component comprising:
- a substrateless optoelectronic semiconductor chip having a first main face at a top side and a second main face at an underside;
- a metallic carrier, which is arranged at the underside of the optoelectronic semiconductor chip; and
- an electrically insulating layer, which covers the metallic carrier at a outer surface of the metallic carrier which faces the optoelectronic semiconductor chip and which is free from the optoelectronic semiconductor chip, wherein the metallic carrier projects beyond the optoelectronic semiconductor chip in at least one lateral direction, wherein the metallic carrier is deposited electrolytically or in an electroless fashion at the second main face of the optoelectronic semiconductor chip, and wherein the electrically insulating layer reflects electromagnetic radiation that is to be emitted or detected by the optoelectronic semiconductor chip during operation, wherein the electrically insulating layer appears white.

15. The optoelectronic semiconductor component according to claim 14, wherein the electrically insulating layer comprises particles of a filler and wherein the filler is given by one of the following materials: metal oxide, metal fluoride, silicon oxide.

* * * * *